(12) United States Patent
Kim et al.

(10) Patent No.: US 7,749,326 B2
(45) Date of Patent: Jul. 6, 2010

(54) CHEMICAL VAPOR DEPOSITION APPARATUS

(75) Inventors: Chang Sung Sean Kim, Gyeonggi-Do (KR); Jong Pa Hong, Gyeonggi-Do (KR); Joong El Ghim, Gyeonggi-Do (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 161 days.

(21) Appl. No.: 12/177,037

(22) Filed: Jul. 21, 2008

(65) Prior Publication Data

US 2009/0288604 A1    Nov. 26, 2009

(30) Foreign Application Priority Data

May 22, 2008    (KR) .................... 10-2008-0047510

(51) Int. Cl.
*C23C 16/455*    (2006.01)
*C23C 16/458*    (2006.01)
*H01L 21/306*    (2006.01)
*C23F 1/00*    (2006.01)
*C23C 16/06*    (2006.01)
*C23C 16/22*    (2006.01)

(52) U.S. Cl. ............. 118/715; 156/345.33; 156/345.55; 156/345.54; 118/729; 118/730

(58) Field of Classification Search ................ 118/715, 118/729, 730; 156/345.33, 345.55, 345.54
See application file for complete search history.

(56) References Cited

U.S. PATENT DOCUMENTS 4,597,986 A * 7/1986 Scapple et al. .............. 427/582
6,206,976 B1 * 3/2001 Crevasse et al. ............ 118/720

* cited by examiner

*Primary Examiner*—Rudy Zervigon
(74) *Attorney, Agent, or Firm*—Lowe Hauptman Ham & Berner, LLP

(57) ABSTRACT

Provided is a chemical vapor deposition apparatus including a reaction chamber; a susceptor that is provided in the reaction chamber and has a plurality of wafers mounted thereon; a rotation driving unit that rotates the susceptor; a gas inlet that is provided in the reaction chamber and introduces reaction gas into the reaction chamber from the outside of the reaction chamber; a gas outlet that is provided in the reaction chamber and discharges the reaction gas, of which the reaction is finished, from the inside of the reaction chamber along the rotation-axis direction of the susceptor; and a variable gas-flow adjusting unit that is provided between the gas inlet and the gas outlet and is formed by superimposing a plurality of gas jetting plates having a plurality of holes.

11 Claims, 4 Drawing Sheets

[FIG. 1]
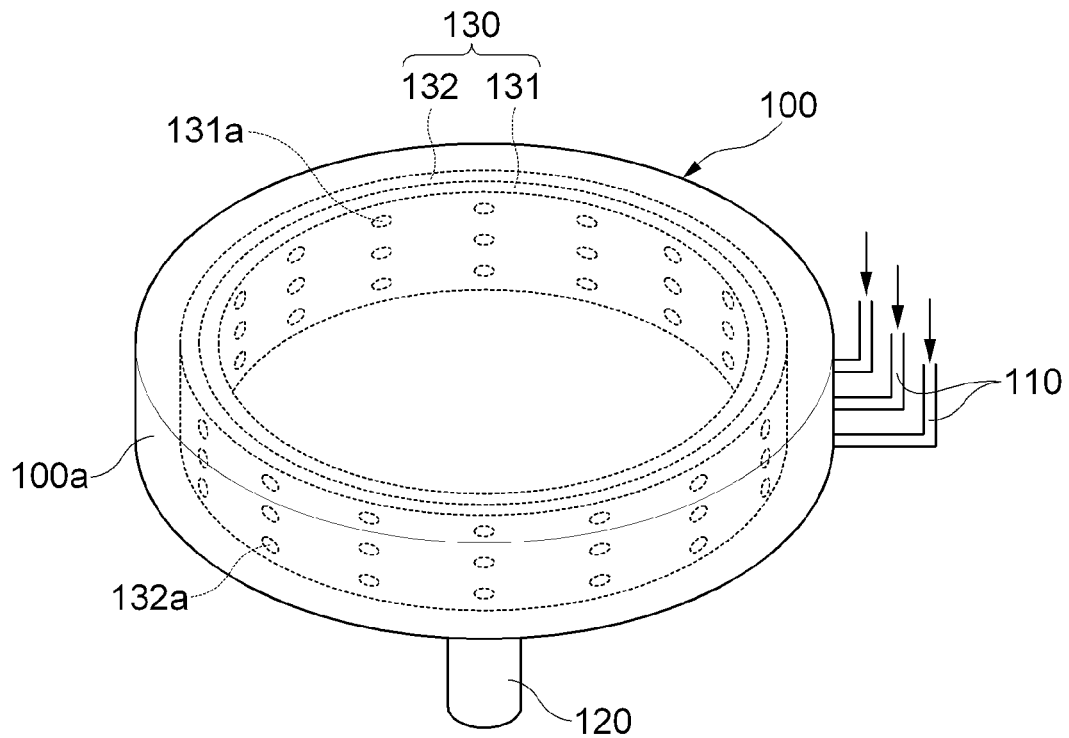
[FIG. 2]
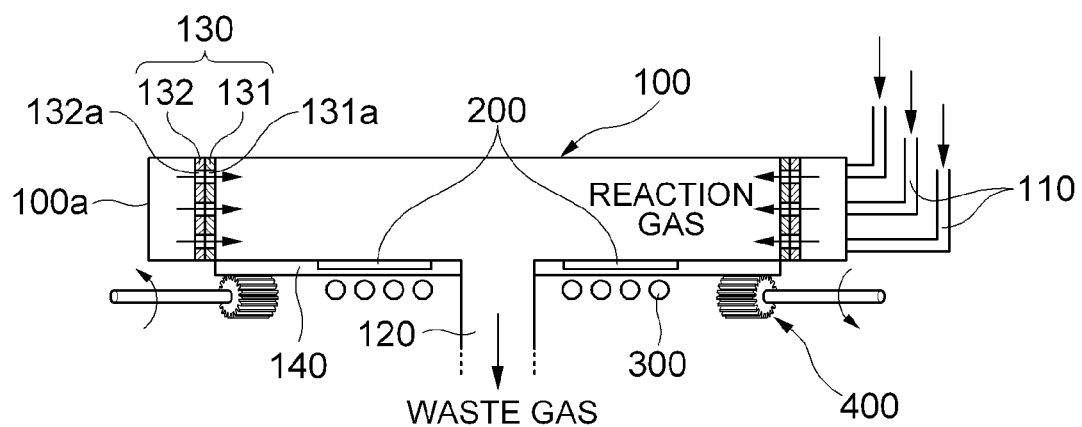

[FIG. 3]
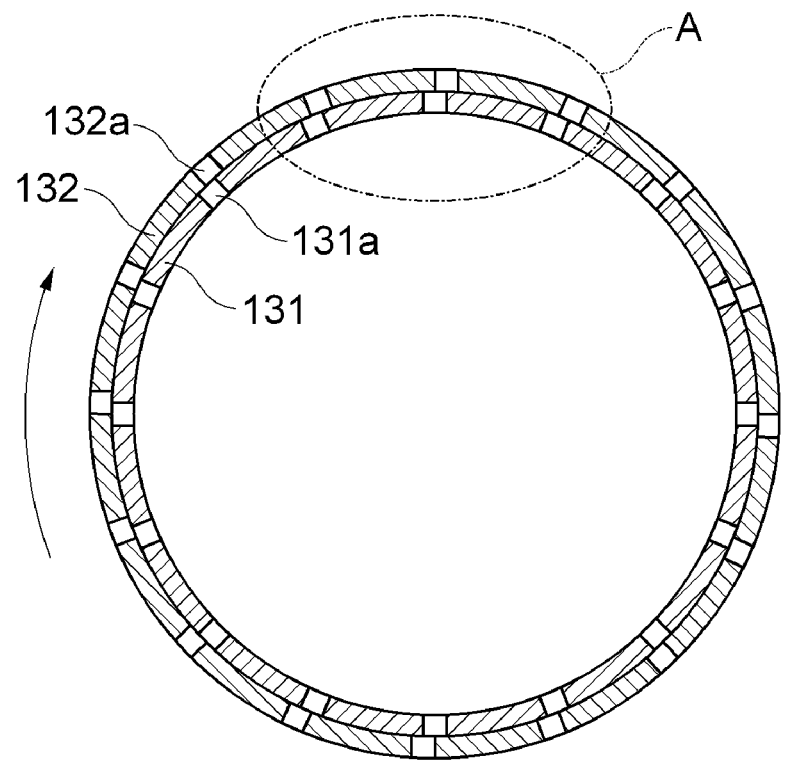
[FIG. 4]
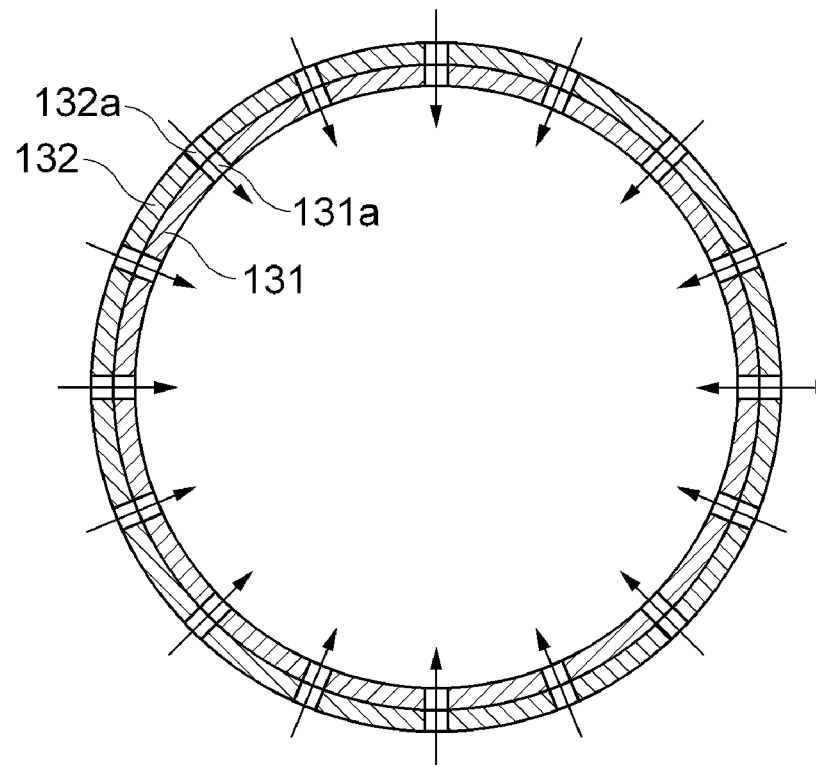

[FIG. 5]
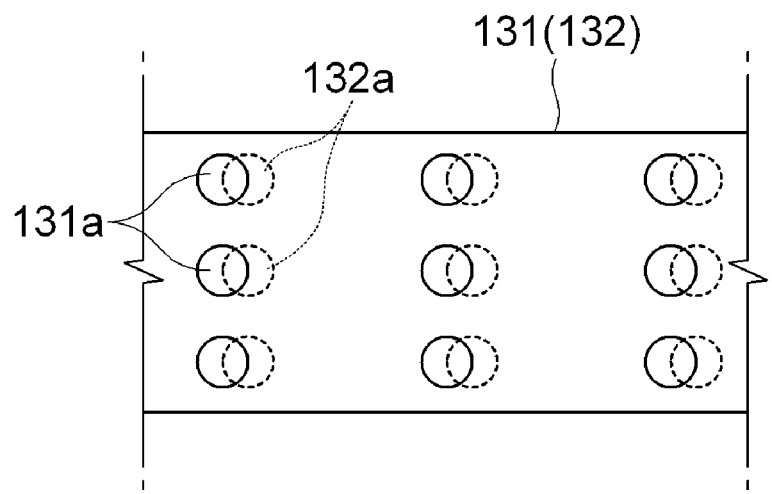
[FIG. 6]
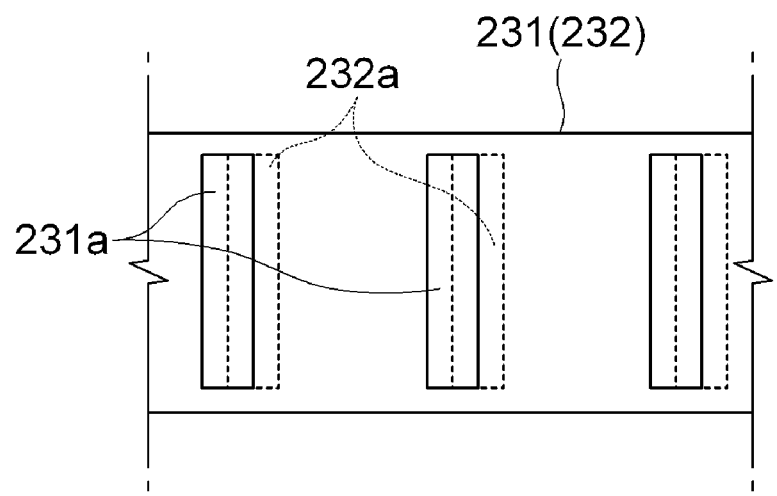
[FIG. 7]
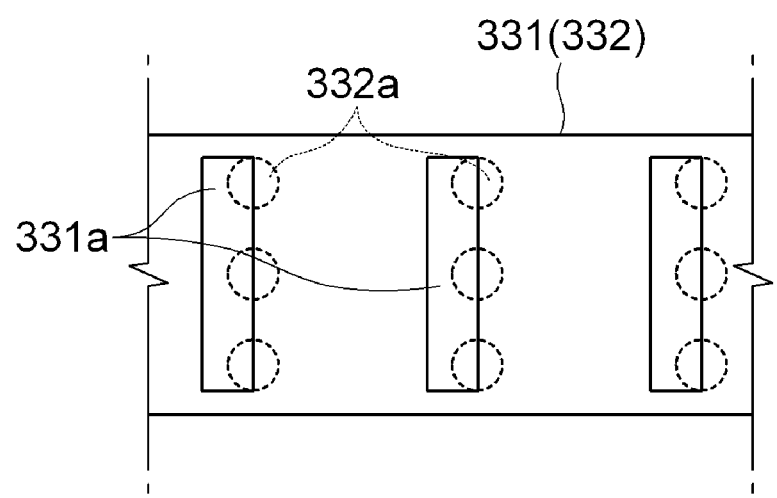

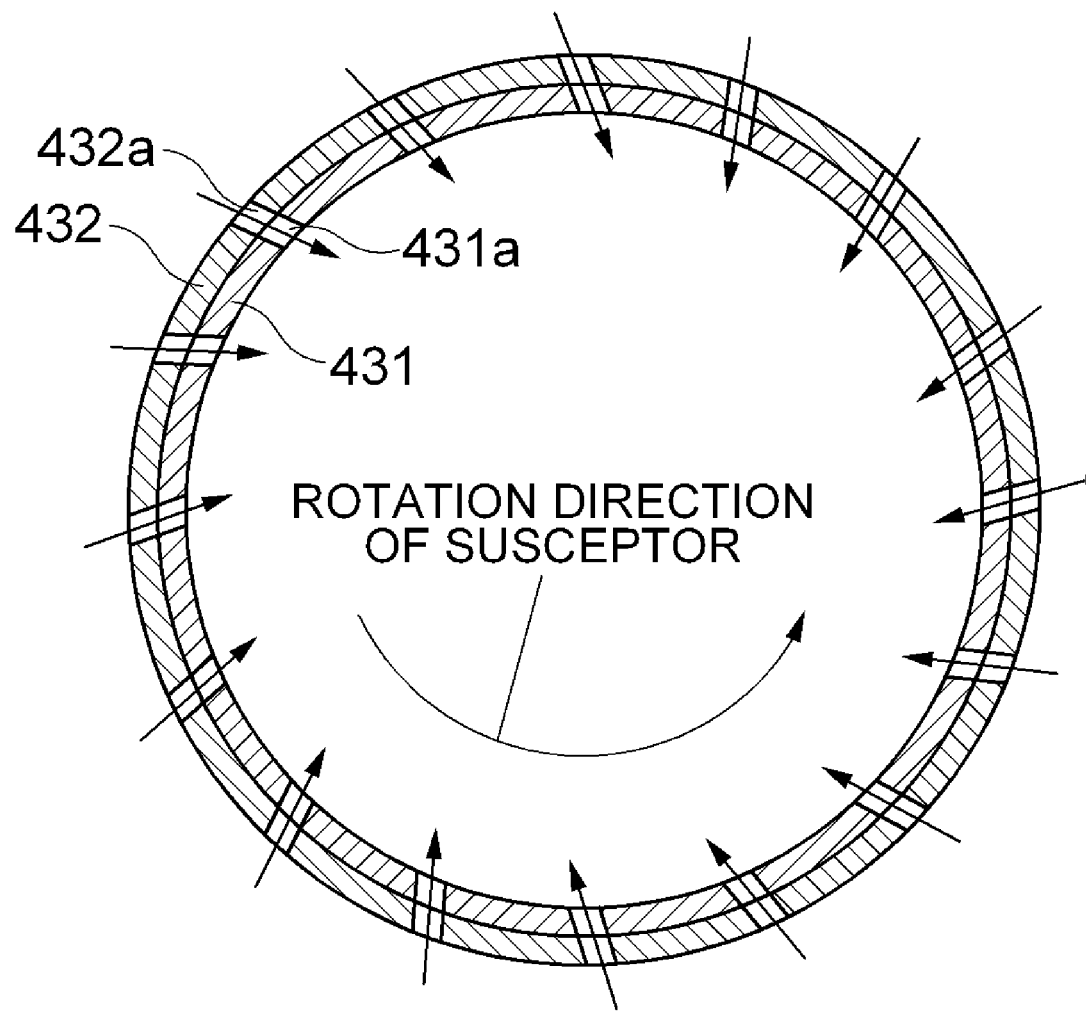
[FIG. 8]

CHEMICAL VAPOR DEPOSITION APPARATUS

CROSS-REFERENCE TO RELATED APPLICATIONS

This application claims the benefit of Korean Patent Application No. 10-2008-0047510 filed with the Korea Intellectual Property Office on May 22, 2008, the disclosure of which is incorporated herein by reference.

BACKGROUND OF THE INVENTION

1. Field of the Invention

The present invention relates to a chemical vapor deposition apparatus which includes a variable gas-flow adjusting unit which uniformly distributes reaction gas introduced into a reaction chamber.

2. Description of the Related Art

In general, CVD (Chemical Vapor Phase Deposition) is mainly used for growing various crystal films on various substrates.

Compared with LPE (Liquid Phase Epitaxy), the quality of crystal grown by CVD is excellent, but the growth speed of crystal is relatively low.

To overcome such a problem, a growth method is widely adopted, in which films are simultaneously grown on several substrates in one growth cycle.

However, when films are simultaneously grown on several substrates, the temperature of the respective substrates and a reaction gas flow on the substrates should be constantly maintained, in order to guarantee the same quality for the films grown on the respective substrates.

To achieve such a construction, a variety of methods have been used. In a first method, several injection pipes are used to constantly maintain gas flows on the substrates. In a second method, several substrates are arranged in a radial shape with respect to one rotation axis and are rotated on the same axis. In a third method, several substrates are rotated independently from each other. Such methods may be separately used or may be combined.

However, in the method in which several substrates are arranged on one rotation axis and reaction gas is introduced toward the center of the inside of a reaction chamber from the outside of the reaction chamber in a direction perpendicular to the rotation axis, the uniform flow of the reaction gas cannot be implemented. Accordingly, it is difficult to grow a high-quality thin film on a wafer.

SUMMARY OF THE INVENTION

An advantage of the present invention is that it provides a chemical vapor deposition apparatus including a variable gas-flow adjusting unit which uniformly distributes reaction gas introduced into a reaction chamber, thereby growing a high-quality thin film.

Additional aspects and advantages of the present general inventive concept will be set forth in part in the description which follows and, in part, will be obvious from the description, or may be learned by practice of the general inventive concept.

According to an aspect of the invention, a chemical vapor deposition apparatus comprises a reaction chamber; a susceptor that is provided in the reaction chamber and has a plurality of wafers mounted thereon; a rotation driving unit that rotates the susceptor; a gas inlet that is provided in the reaction chamber and introduces reaction gas into the reaction chamber from the outside of the reaction chamber; a gas outlet that is provided in the reaction chamber and discharges the reaction gas, of which the reaction is finished, from the inside of the reaction chamber along the rotation-axis direction of the susceptor; and a variable gas-flow adjusting unit that is provided between the gas inlet and the gas outlet and is formed by superimposing a plurality of gas jetting plates having a plurality of holes.

The chemical vapor deposition apparatus may further comprise a heating unit that is provided in one side of the susceptor so as to provide radiant heat to the susceptor.

Preferably, the plurality of gas jetting plates forming the variable gas-flow adjusting unit are superimposed toward the center of the reaction chamber from the outside of the reaction chamber.

The respective gas jetting plates forming the variable gas-flow adjusting unit may be formed in a ring shape.

The variable gas-flow adjusting unit may adjust the reaction gas flow, depending on the overlapping area of the holes which overlap each other when one or more gas jetting plates among the plurality of gas jetting plates are rotated.

The holes formed in the respective gas jetting plates forming the variable gas-flow adjusting unit may be inclined in a direction eccentric with the rotation-axis center of the susceptor.

The direction of the reaction gas jetted through the variable gas-flow adjusting unit may be adjusted by adjusting the inclination angle of the holes formed in the respective gas jetting plates.

The direction eccentric with the rotation-axis center of the susceptor may be set to be reverse to the rotation direction of the susceptor.

The holes formed in the respective gas jetting plates forming the variable gas-flow adjusting unit may have a circular, elliptical, or polygonal shape.

The holes formed in the respective gas jetting plates forming the variable gas-flow adjusting unit may have a slit shape which extends in a horizontal or vertical direction.

The holes formed in the adjacent gas jetting plates among the plurality of gas jetting plates forming the variable gas-flow adjusting unit may have the same shape.

The holes formed in the adjacent gas jetting plates among the plurality of gas jetting plates forming the variable gas-flow adjusting unit may have different shapes from each other.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a schematic perspective view of a chemical vapor deposition apparatus according to an embodiment of the invention;

FIG. 2 is a schematic cross-sectional view of the chemical vapor deposition apparatus according to the embodiment of the invention;

FIG. 3 is a schematic cross-sectional view of a variable gas-flow adjusting unit of FIG. 2;

FIG. 4 is a diagram showing a state where the area of overlapping holes is maximized by rotating an inner gas jetting plate of FIG. 3;

FIG. 5 is a front view of the chemical vapor deposition apparatus, showing a portion A of FIG. 3 in detail;

FIGS. 6 and 7 are diagrams showing other examples of the holes formed in the respective gas jetting plates composing the variable gas-flow adjusting unit of FIG. 5; and FIG. 8 is a diagram showing another example of the holes formed in the respective gas jetting plates composing the variable air-current adjusting unit of FIG. 2.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, a chemical vapor deposition apparatus according to the present invention will be described in detail with reference to the accompanying drawings.

FIG. 1 is a schematic perspective view of a chemical vapor deposition apparatus according to an embodiment of the invention. FIG. 2 is a schematic cross-sectional view of the chemical vapor deposition apparatus according to the embodiment of the invention. FIG. 3 is a schematic cross-sectional view of a variable gas-flow adjusting unit of FIG. 2. FIG. 4 is a diagram showing a state where the area of overlapping holes is maximized by rotating an inner gas jetting plate of FIG. 3. FIG. 5 is a front view of the chemical vapor deposition apparatus, showing a portion A of FIG. 3 in detail.

FIGS. 6 and 7 are diagrams showing other examples of the holes formed in the respective gas jetting plates composing the variable gas-flow adjusting unit of FIG. 5. FIG. 8 is a diagram showing another example of the holes formed in the respective gas jetting plates composing the variable air-current adjusting unit of FIG. 2.

As shown in FIGS. 1 and 2, the chemical vapor deposition apparatus according to the embodiment of the invention includes a reaction chamber 100, a susceptor 140, a rotation driving unit 400, a gas inlet 110, a gas outlet 120, a heating unit 300, and a variable gas-flow adjusting unit 130.

The reaction chamber 100 provides an internal space with a predetermined size such that the chemical vapor reaction between reaction gas introduced into the reaction chamber 100 and wafers 200 is performed. Further, the reaction chamber 100 may include a heat insulator provided on the inner surface thereof so as to endure a high-temperature atmosphere.

The susceptor 140 may have a plurality of pockets in which a plurality of wafers 200 can be respectively mounted. The susceptor 140 is formed in a disk shape having a smaller diameter than the reaction chamber 100 and has a hole formed in the center thereof, the hole corresponding to the gas outlet 120 through which waste gas is discharged from the inside of the reaction chamber 100.

The rotation driving unit 400 is provided under the susceptor 140 so as to rotate the susceptor 140. Although not shown, various rotation driving devices such as a driving gear, a driven gear, a belt, a rotation motor and so on may be applied as the rotation driving unit for rotating the susceptor 140.

The heating unit 300 is provided on the susceptor 140 on which the wafers 200 are mounted and provides radiant heat to the susceptor 140 such that the wafers 200 are indirectly heated. As for the heating unit 300, various heating devices such as an electric heater, a high-frequency induction heater, an infrared-ray radiating device and so on may be applied.

The gas inlet 110 is provided on an outer surface 100a of the reaction chamber 100 so as to provide reaction gas into the reaction chamber 100 from the outside of the reaction chamber 100. The gas inlet 100 may be composed of one or more gas pipes, and the number of gas pipes and the type of reaction gas may be changed depending on a growth layer which is to be deposited on the wafers 200.

The gas outlet 120 provided on or under the center of the reaction chamber 100 discharges waste gas, of which the reaction is finished, to the outside of the reaction chamber 100 along the rotation-axis direction of the susceptor 140.

The variable gas-flow adjusting unit 130 is provided between the gas inlet 110 and the gas outlet 120 within the reaction chamber 100 and is formed by superimposing a plurality of gas jetting plates 131 and 132 having a plurality of holes 131a and 132a.

Preferably, the gas jetting plates 131 and 132 composing the variable gas-flow adjusting unit 130 are superimposed toward the center of the reaction chamber 100 from the outside of the reaction chamber 100.

The respective gas jetting plates 131 and 132 composing the variable gas-flow adjusting unit 130 may be formed in a ring shape corresponding to the shape of the reaction chamber 100.

The variable gas-flow adjusting unit 130 can adjust the reaction gas flow, depending on the overlapping area of the holes 131a and 132a which overlap each other when one or more gas jetting plates 131 and 132 among the plurality of gas jetting plates 131 and 132 are rotated.

For example, as shown in FIGS. 3 and 5, when the gas jetting plate 131 positioned inward between the gas jetting plates 131 and 132 is rotated in such a manner that the positions of the holes 131a formed in the gas jetting plate 131 deviate from those of the holes 132a formed in the gas jetting plate 132, the overlapping area of the holes 131a and 132a decreases. Then, when the reaction gas introduced into the reaction chamber 100 through the gas inlet 110 passes through the holes 131a and 132a so as to be jetted onto the susceptor 140, the flow rate and speed of the reaction gas decreases.

Further, as shown in FIG. 4, when the gas jetting plate 131 positioned inward between the gas jetting plates 131 and 132 is rotated in such a manner that the positions of the holes 131a formed in the gas jetting plate 131 coincide with those of the holes 132a formed in the gas jetting plate 132, the overlapping area of the holes 131a and 132a increases. Then, when the reaction gas introduced into the reaction chamber 100 through the gas inlet 110 passes through the holes 131a and 132a so as to be jetted onto the susceptor 140, the flow rate and speed of the reaction gas increases.

Referring to FIG. 5, the holes 131a and 132a formed in the respective gas jetting plates 131 and 132 forming the gas flow adjusting unit 130 may be formed in a circular shape. However, although not shown, the holes 131a and 132a may be formed in an elliptical or polygonal shape.

As shown in FIG. 6, holes 231a and 232a formed in gas jetting plates 231 and 232 forming the variable gas-flow adjusting unit 130 may be formed in a slit shape which extends in a horizontal or vertical direction.

As shown in FIGS. 5 and 6, the holes 131a and 131a or 231a and 232a formed in the gas jetting plates 131 and 132 or 231 and 232 forming the variable gas-flow adjusting unit 130 may be formed in the same shape.

Alternatively, as shown in FIG. 7, holes 331a and 332a formed in gas jetting plate 331 and 332 forming the variable gas-flow adjusting unit 130 may be formed in different shapes from each other.

That is, the holes 331a formed in the gas jetting plate 331 positioned inward between the gas jetting plates 331 and 332 may be formed in a slit shape, and the holes 332a formed in the gas jetting plate 332 may be formed in a circular shape.

Meanwhile, as shown in FIG. 8, holes 431a and 432a formed in gas jetting plates 431 and 432 forming the variable gas-flow adjusting unit 130 may be formed so as to be inclined in a direction eccentric with the rotation-axis center of the susceptor 140 (refer to FIG. 2).

That is, the inclination angle of the holes 431a and 432a formed in the gas jetting plates 431 and 432 may be adjusted so as to adjust the direction of the reaction gas which is jetted through the variable gas-flow adjusting unit 130.

At this time, the direction eccentric with the rotation-axis center of the susceptor 140 is set to a direction reverse to the rotation direction of the susceptor 140 such that the jetted reaction gas is effectively provided to the plurality of wafers 200 mounted on the susceptor 140.

According to the present invention, as the variable gas-flow adjusting unit is provided in the chemical vapor deposition apparatus, the reaction gas introduced into the reaction chamber can be uniformly distributed, thereby forming a high-quality thin film. Further, as the variable gas-flow adjusting unit is formed by superimposing the gas jetting plates having the plurality of holes, the overlapping area of the holes through which the reaction gas passes can be adjusted, which makes it possible to reduce a reprocessing cost caused by the lack of specification of the holes.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A chemical vapor deposition apparatus comprising:
    a reaction chamber;
    a susceptor that is provided in the reaction chamber and has a plurality of wafers mounted thereon;
    a rotation driving unit that rotates the susceptor;
    a gas inlet that is provided in the reaction chamber and introduces reaction gas into the reaction chamber from the outside of the reaction chamber;
    a gas outlet that is provided in the reaction chamber and discharges the reaction gas, of which the reaction is finished, from the inside of the reaction chamber along the rotation-axis direction of the susceptor; and
    a variable gas-flow adjusting unit that is provided between the gas inlet and the gas outlet within the reaction chamber and is formed by superimposing a plurality of gas jetting plates having a plurality of holes, wherein the plurality of jetting plates are rings arranged in a concentric formation.

2. The chemical vapor deposition apparatus according to claim 1, wherein the plurality of gas jetting plates forming the variable gas-flow adjusting unit are superimposed toward the center of the reaction chamber from the outside of the reaction chamber.

3. The chemical vapor deposition apparatus according to claim 1, wherein the variable gas-flow adjusting unit adjusts the reaction gas flow, depending on the overlapping area of the holes which overlap each other when one or more gas jetting plates among the plurality of gas jetting plates are rotated.

4. The chemical vapor deposition apparatus according to claim 1, wherein the holes formed in the respective gas jetting plates forming the variable gas-flow adjusting unit are inclined in a direction eccentric with the rotation-axis center of the susceptor.

5. The chemical vapor deposition apparatus according to claim 4, wherein the direction of the reaction gas jetted through the variable gas-flow adjusting unit is adjusted by adjusting the inclination angle of the holes formed in the respective gas jetting plates.

6. The chemical vapor deposition apparatus according to claim 4, wherein the direction eccentric with the rotation-axis center of the susceptor is set to be reverse to the rotation direction of the susceptor.

7. The chemical vapor deposition apparatus according to claim 1, wherein the holes formed in the respective gas jetting plates forming the variable gas-flow adjusting unit have a circular, elliptical, or polygonal shape.

8. The chemical vapor deposition apparatus according to claim 1, wherein the holes formed in the respective gas jetting plates forming the variable gas-flow adjusting unit have a slit shape which extends in a horizontal or vertical direction.

9. The chemical vapor deposition apparatus according to claim 1, wherein the holes formed in the adjacent gas jetting plates among the plurality of gas jetting plates forming the variable gas-flow adjusting unit have the same shape.

10. The chemical vapor deposition apparatus according to claim 1, wherein the holes formed in the adjacent gas jetting plates among the plurality of gas jetting plates forming the variable gas-flow adjusting unit have different shapes from each other.

11. The chemical vapor deposition apparatus according to claim 1 further comprising:
    a heating unit that is provided in one side of the susceptor so as to provide radiant heat to the susceptor.

* * * * *